(12) United States Patent
Kumar et al.

(10) Patent No.: US 7,834,653 B1
(45) Date of Patent: Nov. 16, 2010

(54) FAILSAFE AND TOLERANT DRIVER ARCHITECTURE AND METHOD

(75) Inventors: Pankaj Kumar, Karnataka (IN); Pramod Elamannu Parameswaran, Karnataka (IN); Makeshwar Kothandaraman, Whitehall, PA (US); Vani Deshpande, Karnataka (IN)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/610,275

(22) Filed: Oct. 31, 2009

(51) Int. Cl.
*H03K 19/007* (2006.01)

(52) U.S. Cl. .............................. 326/14; 326/58; 326/86

(58) Field of Classification Search ............. 326/10–15, 326/56–58, 82–83, 86–87
See application file for complete search history.

(56) References Cited

U.S. PATENT DOCUMENTS

| | | | |
|---|---|---|---|
| 5,400,202 A | 3/1995 | Metz et al. | |
| 6,320,735 B1 | 11/2001 | Anderson | |
| 6,583,646 B1 | 6/2003 | Patel et al. | |
| 7,002,379 B2 | 2/2006 | Ajit | |
| 7,071,764 B1 | 7/2006 | Kiani | |
| 7,477,075 B2 | 1/2009 | Kesselring | |
| 7,573,304 B2 | 8/2009 | Takemura et al. | |
| 7,622,961 B2 * | 11/2009 | Grochowski et al. | 327/20 |
| 2002/0067185 A1 * | 6/2002 | Kunz et al. | 326/14 |
| 2002/0070751 A1 * | 6/2002 | Kunz et al. | 326/14 |
| 2004/0089909 A1 | 5/2004 | Lee et al. | |
| 2006/0170054 A1 | 8/2006 | Mergens et al. | |
| 2007/0075748 A1 | 4/2007 | Bhattacharya et al. | |
| 2009/0027089 A1 | 1/2009 | Hebenstreit | |

FOREIGN PATENT DOCUMENTS

WO  WO-2006/066159  6/2006

\* cited by examiner

*Primary Examiner*—James H. Cho
*Assistant Examiner*—Jason M Crawford
(74) *Attorney, Agent, or Firm*—Raj Abhyanker, PC

(57) ABSTRACT

A method includes controllably utilizing a control signal generated by an Input/Output (IO) core to isolate a current path from an external voltage supplied through an IO pad to a supply voltage by transmitting a same voltage at an input terminal of a transistor, configured to be part of a number of cascaded transistors of an IO driver of an interface circuit, to an output terminal thereof during a failsafe mode of operation and a tolerant mode of operation. The method also includes feeding back an appropriate voltage to a floating node created by the isolation of the current path, and controlling a voltage across each transistor of the number of cascaded transistors to be within an upper tolerable limit thereof through an application of a gate voltage to each transistor derived from the supply voltage or the external voltage supplied through the IO pad.

20 Claims, 12 Drawing Sheets

FAILSAFE AND TOLERANT DRIVER ARCHITECTURE AND METHOD

FIELD OF TECHNOLOGY

This disclosure relates generally to Input/Output (IO) circuits and, more particularly, to a method, an apparatus, and a system to realize a failsafe/tolerant driver architecture.

BACKGROUND

An integrated circuit (IC) may include a constituent section that operates at a voltage different from another constituent section. Interfacing between constituent sections operating at different voltages may require a buffer circuit that may include active elements (e.g., Metal-Oxide-Semiconductor (MOS) transistors) operating at a voltage (e.g., 1.8 V) lower than a voltage across terminals thereof.

FIG. 1 shows a schematic view of an IO driver 100 to be interfaced with a higher voltage. The IO driver 100 may include a p-channel Metal-Oxide-Semiconductor (PMOS) transistor $M_1$ 102 and an n-channel MOS (NMOS) transistor $M_2$ 104. The source (S) terminal of $M_1$ 102 may be connected to a supply voltage $V_{DDIO}$ 106, and the source (S) terminal of $M_2$ 104 may be connected to a supply voltage $V_{SS}$ 110. The bulk (B) terminals of the transistors ($M_1$ 102, $M_2$ 104) may be shorted with the source (S) terminals thereof to connect the bulk (B) terminals of the transistors ($M_1$ 102, $M_2$ 104) also to $V_{DDIO}$ 106 and $V_{SS}$ 110 respectively. The drain (D) terminals of $M_1$ 102 and $M_2$ 104 may be connected to one another, as shown in FIG. 1.

An external voltage from an Input/Output (IO) pad 108 of an IC may be supplied to each of the drain (D) terminals of $M_1$ 102 and $M_2$ 104. The gate (G) terminals of the transistors ($M_1$ 102, $M_2$ 104) may be driven by control signals (CTRL1 112 and CTRL2 114) generated from a control circuit associated with the IO driver 100. When the IO pad 108 voltage (e.g., 3.465 V) is higher than the supply voltage, $V_{DDIO}$ 106 (e.g., 1.8 V, 2.5 V) or when $V_{DDIO}$ 106 is zero, the parasitic diode $D_1$ 116, shown in FIG. 1 as being associated with $M_1$ 102, may be turned ON, leading to there being a direct path between the IO pad 108 voltage and the supply voltage $V_{DDIO}$ 106. The turning ON of $D_1$ 116 may lead to the conducting of a large current, which, in turn, may cause large leakage currents to flow. FIG. 1 also shows the parasitic diode $D_2$ 118 associated with $Q_2$ 104.

A high value of the IO pad 108 voltage during the presence/absence of $V_{DDIO}$ 106 may, therefore, compromise the reliability of the IO driver 100. A number of p-channel and n-channel transistors may be stacked on top of one another to cushion the effects of the large current conducted. However, this may merely serve to mitigate the effects of the large current and not solve the problem entirely.

SUMMARY

Disclosed are a method, an apparatus, and a system to realize a failsafe/tolerant driver architecture.

In one aspect, a method includes controllably utilizing a control signal generated by an Input/Output (IO) core to isolate a current path from an external voltage supplied through an IO pad to a supply voltage by transmitting a same voltage at an input terminal of a transistor, configured to be part of a number of cascaded transistors of an IO driver of an interface circuit, to an output terminal thereof during a failsafe mode of operation and a tolerant mode of operation. The method also includes feeding back an appropriate voltage to a floating node created by the isolation of the current path, and controllably utilizing the control signal to control a voltage across each transistor of the number of cascaded transistors to be within an upper tolerable limit thereof through an application of a gate voltage to each transistor of the number of cascaded transistors.

The gate voltage is derived from the supply voltage or the external voltage supplied through the IO pad during modes of operation thereof including the failsafe mode of operation, the tolerant mode of operation, and a driver mode of operation. The external voltage supplied through the IO pad varies from zero to a value of the supply voltage during the driver mode of operation. The supply voltage is zero during the failsafe mode of operation, and the external voltage supplied through the IO pad increases to a value above the supply voltage during the tolerant mode of operation.

In another aspect, an IO driver circuit includes a number of cascaded transistors, and a pre-driver circuit associated with each transistor of the number of cascaded transistors. The pre-driver circuit controls a voltage across each transistor to be within an upper tolerable limit thereof through an application of a gate voltage to each transistor. The gate voltage is derived a supply voltage or an external voltage supplied through an IO pad during modes of operation thereof based on a controllable utilization of a control signal generated by an IO core. The modes of operation include a driver mode, a failsafe mode, and a tolerant mode.

A current path from the external voltage supplied through the IO pad to the supply voltage is isolated by transmitting a same voltage at an input terminal of a transistor of the number of cascaded transistors to an output terminal thereof, and an appropriate voltage is fed back to a floating node created by the isolation of the current path.

The external voltage supplied through the IO pad varies from zero to a value of the supply voltage during the driver mode of operation. The supply voltage is zero during the failsafe mode of operation, and the external voltage supplied through the IO pad increases to a value above the supply voltage during the tolerant mode of operation.

In yet another aspect, an IO circuit system includes an IO core to generate a control signal, an IO pad to supply an external voltage, and an IO driver circuit to interface with the external voltage supplied by the IO pad based on a controllable utilization of the control signal generated by the IO core. The IO driver circuit includes a number of cascaded transistors and a pre-driver circuit associated with each transistor of the number of cascaded transistors to control a voltage across each transistor to be within an upper tolerable limit thereof through an application of a gate voltage to each transistor derived from a supply voltage or the external voltage supplied through the IO pad during modes of operation thereof. The modes of operation include a driver mode, a failsafe mode, and a tolerant mode.

A current path from the external voltage supplied through the IO pad to the supply voltage is isolated by transmitting a same voltage at an input terminal of a transistor of the number of cascaded transistors to an output terminal thereof, and an appropriate voltage is fed back to a floating node created by the isolation of the current path.

The external voltage supplied through the IO pad varies from zero to a value of the supply voltage during the driver mode of operation. The supply voltage is zero during the failsafe mode of operation, and the external voltage supplied through the IO pad increases to a value above the supply voltage during the tolerant mode of operation.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to realize a failsafe/tolerant driver architecture. Although the present embodiments have been described with reference to specific example embodiments, it will be evident that various modifications and changes may be made to these embodiments without departing from the broader spirit and scope of the various embodiments.

Figure 1:
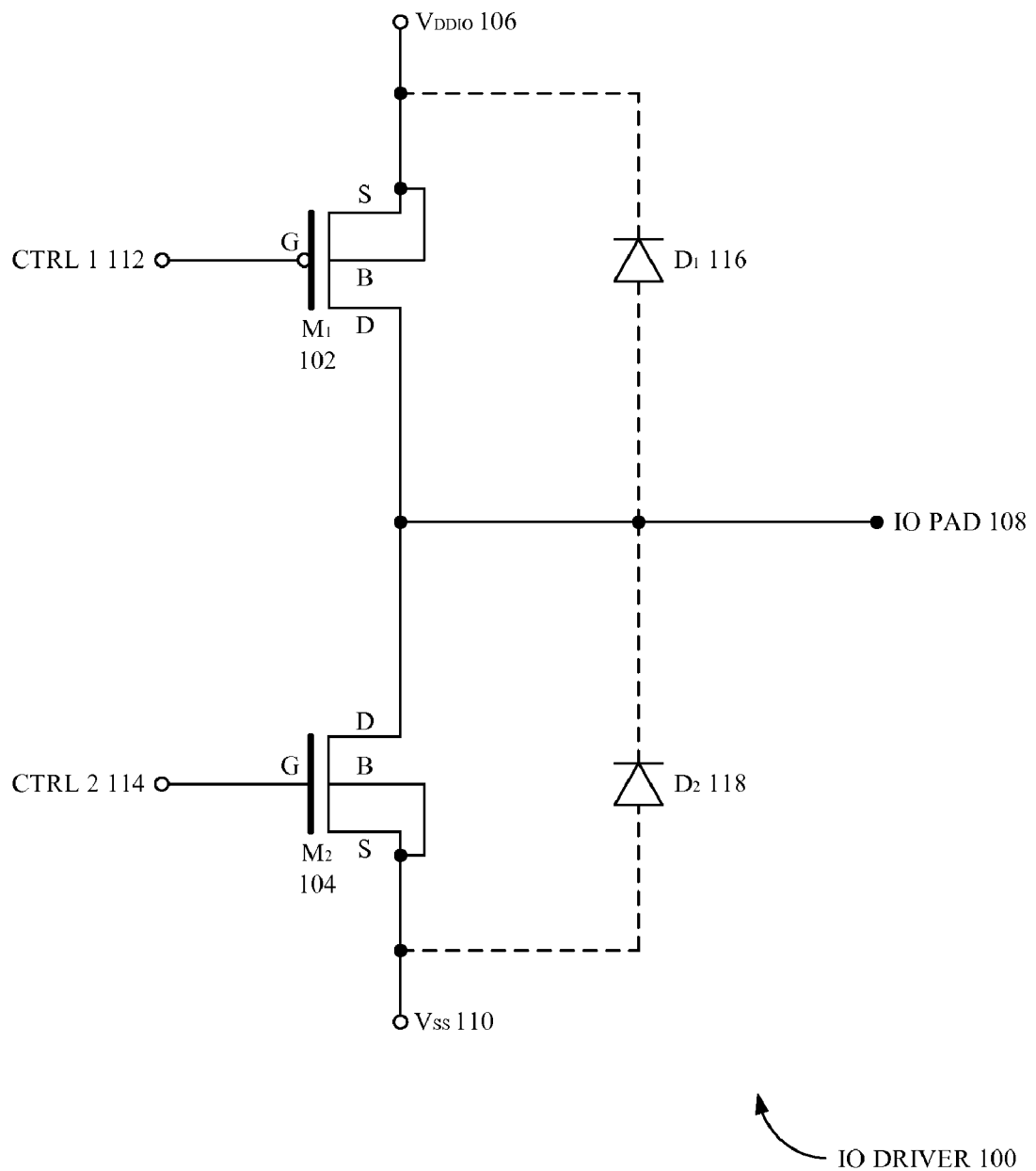
FIG. 1 is a schematic view of an Input/Output (IO) driver.
Figure 2:
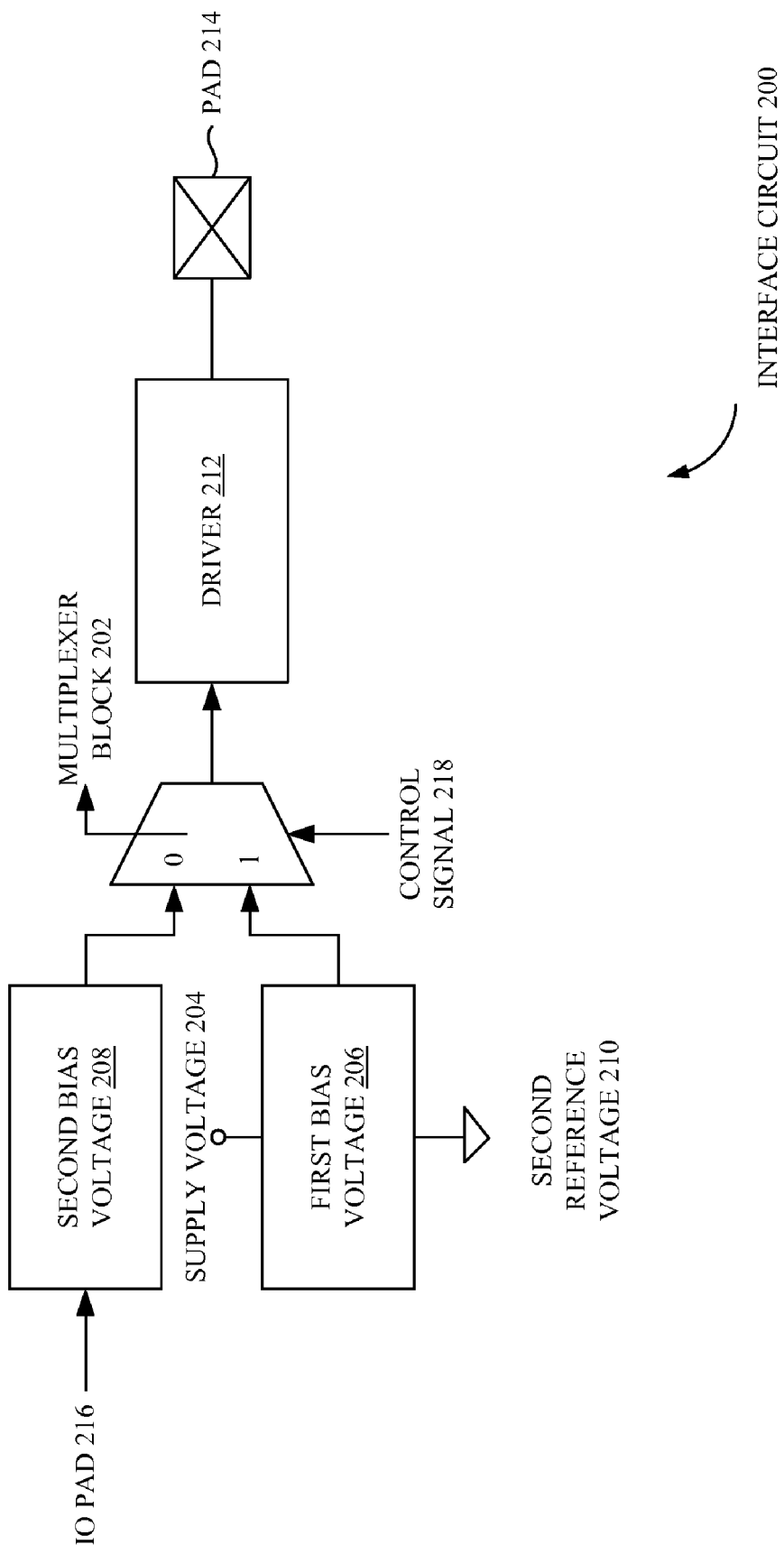
FIG. 2 is a schematic view of an interface circuit, according to one or more embodiments.

FIG. 2 shows an interface circuit 200, according to one or more embodiments. In one or more embodiments, the interface circuit 200 includes a multiplexer block 202 that may be configured to receive a first bias voltage 206 derived from a supply voltage 204 and a second bias voltage 208 derived from an external voltage supplied through an IO pad (shown as IO pad 216 voltage). In one or more embodiments, a control signal 218 generated from an IO core (not shown) may be controllably utilized to derive an output voltage from the first bias voltage 206 during a "high" state of the control signal 218 and an output voltage from the second bias voltage 208 during a "low" state of the control signal 218. In one or more embodiments, the "high" state may be analogous to a logic "1," and the "low" state may be analogous to a logic "0."

In one or more embodiments, the "high" state of the control signal 218 may signify a failsafe mode of operation or a tolerant mode of operation while the "low" state of the control signal 218 may signify a driver mode of operation. In one or more embodiments, IO pad 216 voltage may vary from zero to a value of the supply voltage 204 during the driver mode of operation. In one or more embodiments, the supply voltage 204 may be zero during the failsafe mode of operation. In one or more embodiments, IO pad 216 voltage may increase to a value above the supply voltage 204 during the tolerant mode of operation.

In one or more embodiments, therefore, as shown in FIG. 2, the output of the multiplexer block 202 may be derived from the first bias voltage 206 during the driver mode of operation or derived from the second bias voltage 208 during the failsafe mode of operation and the tolerant mode of operation based on the "high"/"low" state of the control signal 218. In one or more embodiments, the output of the multiplexer block 202 may be coupled to a driver 212 circuit to which the external voltage may be supplied through the IO pad (shown as PAD 214) at a node thereof. In one or more embodiments, the coupling of the output of the multiplexer block 202 to the driver 212 circuit may provide for a reliable operation of the driver 212 circuit, whereby voltages across constituent active circuit elements of the driver 212 circuit are within upper tolerable limits of operating voltages thereof.

Figure 3:
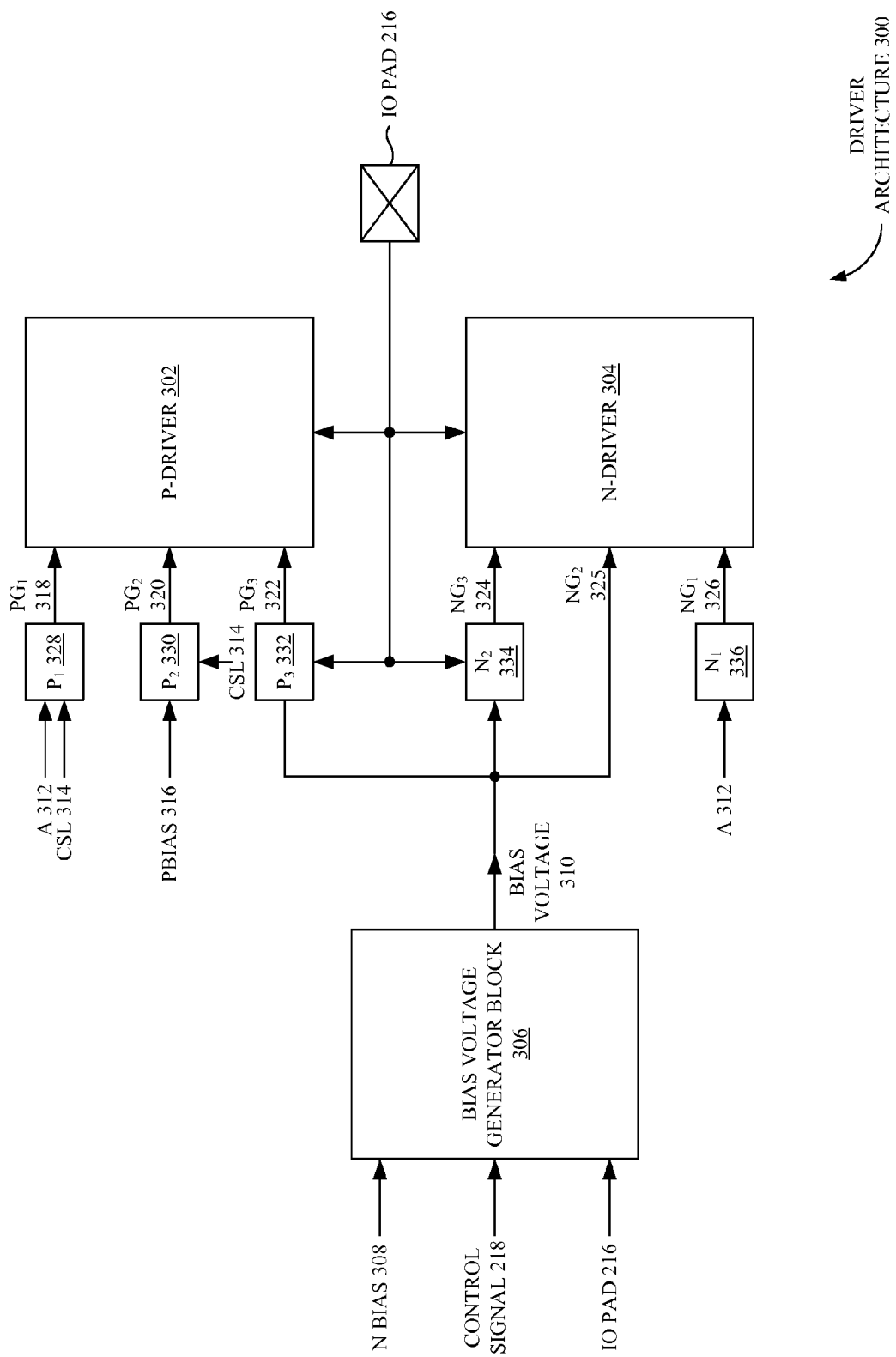
FIG. 3 is a schematic view of a driver architecture, according to one or more embodiments.

FIG. 3 shows a driver 300 architecture, according to one or more embodiments. In one or more embodiments, the driver 300 may include a P-driver 302 stacked on top of an N-driver 304. In one or more embodiments, the P-driver 302 may include a number of p-channel transistors and the N-driver 304 may include a number of n-channel transistors. In one or more embodiments, IO pad 216 voltage may be applied at a node between the P-driver 302 and the N-driver 304. In FIG. 3, the P-driver 302 and the N-driver 304 may include pre-driver circuits ($P_1$ 328, $P_2$ 330, $P_3$ 332, and $N_1$ 336, $N_2$ 334) to output gate voltages ($PG_1$ 318, $PG_2$ 320, $PG_3$ 322, and $NG_1$ 326, $NG_2$ 325, $NG_3$ 324). In one or more embodiments, the gate voltages may be applied to gate (G) terminals of constituent Metal-Oxide-Semiconductor (MOS) transistors of the P-driver 302 and the N-driver 304 respectively to control voltages across the constituent MOS transistors of the P-driver 302 and the N-driver 304 to be within the upper tolerable limits of operating voltages thereof.

In FIG. 3, PBIAS 316 and NBIAS 308 may be the first bias voltage 206 derived from the supply voltage 204. For example, PBIAS 316 may be 0.45 $V_{DDIO}$, where $V_{DDIO}$ is the supply voltage 204, and NBIAS 308 may be 0.55 $V_{DDIO}$. In one or more embodiments, control signal 218 (e.g., Output Enable (OE)) may be generated by the IO core and received as an input by a bias voltage generator block 306. In one or more embodiments, control signal 218 may indicate the mode of operation of the circuit (driver, failsafe, tolerant). In one or more embodiments, the bias voltage generator block 306 may receive IO pad 216 voltage as feedback from the IO pad and, accordingly, when control signal 218 is a logic "1," bias voltage 310 may be equal to NBIAS 308 received as input of the bias voltage generator block 306.

In one or more embodiments, when control signal 218 is a logic "0," bias voltage 310 may be expressed as example Equation 1:

$$V_B = IO_{PAD} - 2V_{tn} \qquad , (1)$$

where $V_B$ may be the bias voltage 310, $IO_{PAD}$ may be the IO pad 216 voltage, and $V_{tn}$ may be the diode drop of an active circuit element (e.g., n-channel MOS (NMOS) transistor). Here, two active circuit elements are assumed. The number of active circuit elements may vary. In one or more embodiments, the bias voltage 310 may be input to $N_2$ 334, and PBIAS 316 may be input to $P_2$ 330. In one or more embodiments, pre-driver input A 312 of $P_1$ 328 and $N_1$ 336 may come through the IO core. In one or more embodiments, CSL 314, input to $P_1$ 328 and $P_2$ 330, may be a level shifted version of control signal 218. Therefore, in one or more embodiments, control signal 218 may be controllably utilized.

In one or more embodiments, IO pad 216 voltage may be passed to $P_3$ 332 and $N_2$ 334, as shown in FIG. 3. In one or more embodiments, constituent transistors of P-driver 302 and N-driver 304 may be large, and at least two transistors may required in each of P-driver 302 and N-driver 304 to interface with high voltages. FIG. 3 shows a three transistor implementation in each of P-driver 302 and N-driver 304 as an example. In one or more embodiments, the number of transistors in P-driver 302 and N-driver 304 may depend on the high voltage being interfaced (reliability requirement). In one or more embodiments, a number of cascaded transistors may be stacked on top of one another to form P-driver 302 and N-driver 304.

Figure 4:
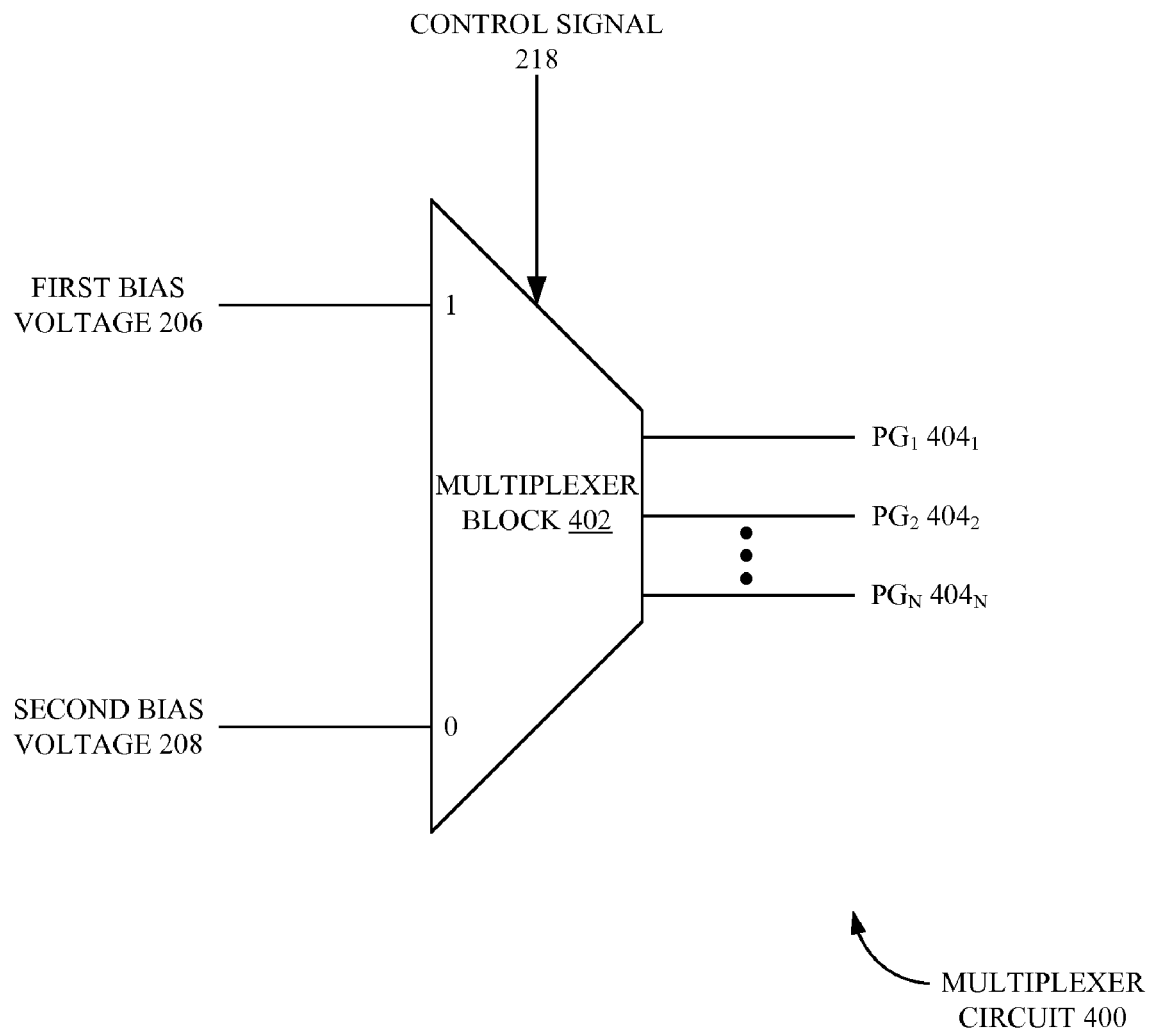
FIG. 4 is a schematic view of a multiplexing involved in the driver architecture of FIG. 3, according to one or more embodiments.

In one or more embodiments, $PG_1$ 318, $PG_2$ 320, and $PG_3$ 322 may be voltages derived by multiplexing the first bias voltage 206 and the second bias voltage 208, based on the state of control signal 218. FIG. 4 shows N outputs of pre-driver circuits ($PG_1$ $404_1$, $PG_2$ $404_2$ ... $PG_N$ $404_N$) being derived from the aforementioned multiplexing process. In FIG. 3, $PG_1$ 318 may be generated by multiplexing the supply voltage 204 with a voltage derived from IO pad 216 voltage, and $PG_2$ 320 may be derived by multiplexing PBIAS 316 and IO pad 216 voltage.

In one or more embodiments, in FIG. 3, the output $NG_1$ 326 may swing from NBIAS 308 to $V_{SS}$ (second reference voltage 210 in FIG. 2), and the second driver transistor of N-driver 304 may be coupled to bias voltage 310. In one or more embodiments, $N_2$ 334 may receive bias voltage 310 and IO pad 216 voltage as inputs thereof, and output $NG_3$ 324 may be equal to the higher of IO pad 216 voltage and bias voltage 310.

In one or more embodiments, pre-driver circuits $P_1$ 328, $P_2$ 330, and $P_3$ 332 may be modified to suit all modes of operation, viz. the driver mode of operation, the failsafe mode of operation, and the tolerant mode of operation. In one or more embodiments, during the driver mode of operation (CSL 314="high"), $P_1$ 328 may act as an inverter, with $PG_1$ 318 swinging from $V_{DDIO}$ 204 to PBIAS 316. In one or more embodiments, during the failsafe/tolerant mode of operation (CSL 314="low"), $PG_1$ 318 may be equal to the higher of $V_{DDIO}$ 204 and bias voltage 310. For example, $PG_1$ 318 may be equal to bias voltage 310 during the failsafe mode of operation and $V_{DDIO}$ 204 during the tolerant mode of operation.

In one or more embodiments, during the driver mode of operation (CSL 314="high"), $PG_2$ 320 may be equal to PBIAS 316. In one or more embodiments, during the failsafe/tolerant mode of operation (CSL 314="low"), $PG_2$ 320 may be equal to IO pad 216 voltage. In one or more embodiments, $P_3$ 332 may receive input from IO pad 216 voltage and bias voltage 310, and may output the minimum of bias voltage 310 and IO pad 216 voltage as $PG_3$ 322.

In one or more embodiments, during the failsafe mode of operation, the gate voltages of pre-driver circuits of the transistors of N-driver 304 may be zero. As second reference voltage 210 ($V_{SS}$) may also be close to zero, N-driver 304 may relatively be safe compared to P-driver 302. Discussion of P-driver 302 architecture, i.e., architecture of the pull-up block, alone, therefore, may suffice to illustrate the concept involved therein.

Figure 5:
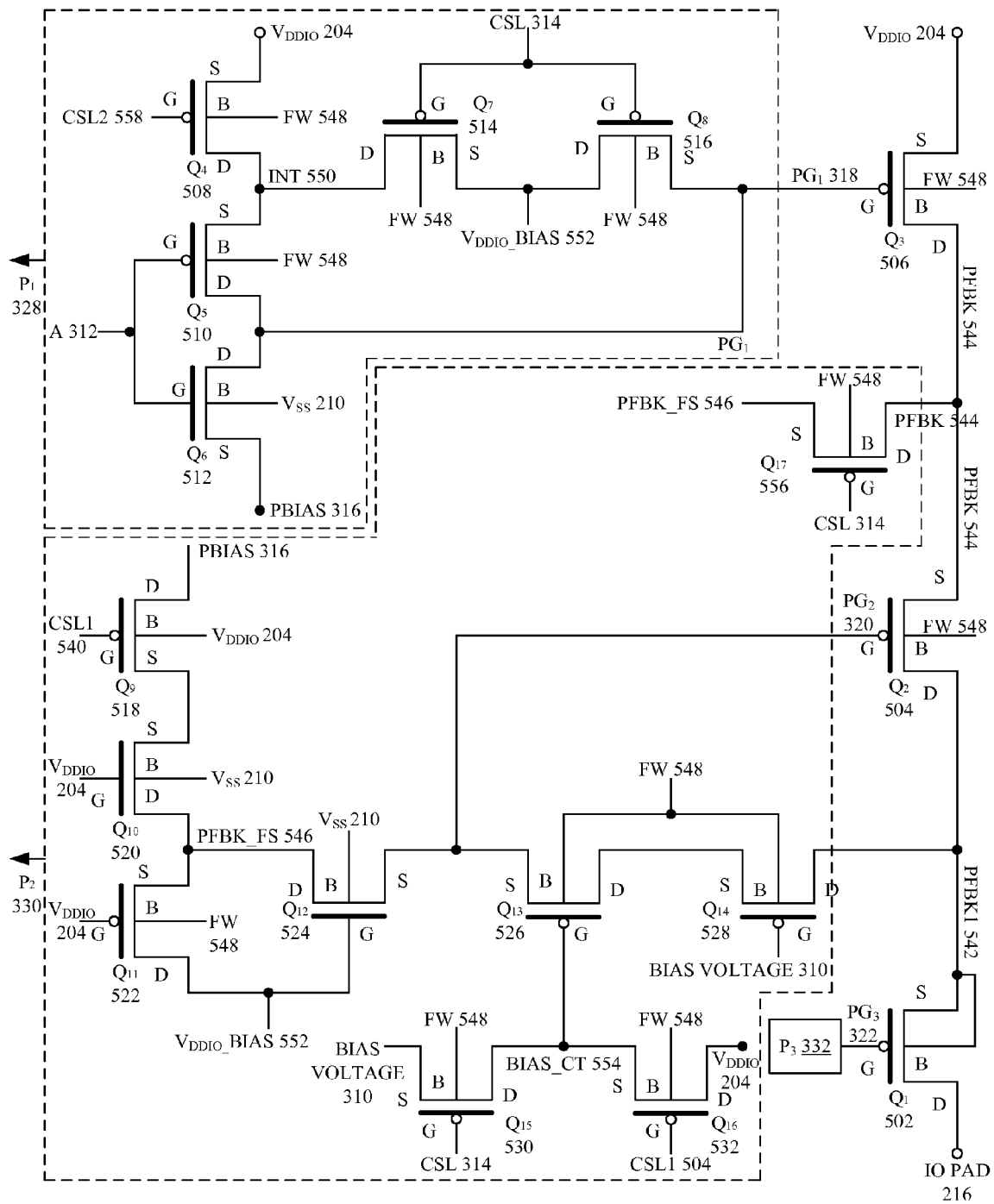
FIG. 5 is a schematic view of a transistor implementation of the driver architecture of FIG. 3, according to one or more embodiments.

FIG. 5 shows the transistor implementation 500 of the driver 300 architecture, according to one or more embodiments. In one or more embodiments, the transistor implementation 500 may include three driver p-channel MOS (PMOS) transistors $Q_1$ 502, $Q_2$ 504, and $Q_3$ 506, with the source (S) terminal of $Q_3$ 506 being coupled to $V_{DDIO}$ 204. In one or more embodiments, $Q_3$ 506, $Q_2$ 504, and $Q_1$ 502 may be cascaded with one another. As discussed above, three transistors are used to merely illustrate the concept involved herein. It is also obvious to one of ordinary skill in the art that the source (S) and drain (S) terminals of a MOS transistor are interchangeable and, therefore, coupling a voltage to the source (S) terminal and outputting another voltage from the drain (D) terminal is equivalent to coupling the voltage to the drain (D) terminal and outputting another voltage from the source (S) terminal. A drain-drain (D-D) path may also be equivalent to a source-drain (S-D) path.

Considering a standard number of cascaded p-channel transistors and n-channel transistors as being part of a driver circuit, when the IO pad 216 voltage exceeds the supply voltage $V_{DDIO}$ 204 during the tolerant mode of operation or when $V_{DDIO}$ 204 is zero during the failsafe mode of operation and IO pad 216 voltage is directly coupled to a source (S) terminal or a drain (D) terminal of a transistor, the path coupling the node of application of IO pad 216 voltage to $V_{DDIO}$ 204 may sink a lot of current, leading to the reliability of the driver circuit being compromised.

Therefore, in one or more embodiments, the current path between IO pad 216 voltage and $V_{DDIO}$ 204 may be isolated in the transistor implementation 500 of FIG. 5 during the tolerant mode of operation and the failsafe mode of operation. In one or more embodiments, the current path may be isolated at $Q_1$ 502, $Q_2$ 504 or $Q_3$ 506, but for purposes of illustration and simplicity of design, the current path may be isolated at $Q_1$ 502, as shown in FIG. 5 and as discussed below.

In one or more embodiments, $P_1$ 328, $P_2$ 330, and $P_3$ 332 are the associated pre-driver circuits of $Q_3$ 506, $Q_2$ 504, and $Q_1$ 502 respectively. In one or more embodiments, the current path between IO pad 216 voltage and $V_{DDIO}$ 204 may be isolated by transmitting a same voltage at the input (i.e., drain (D) terminal) of $Q_1$ 502 to the output (i.e., source (S) terminal) of $Q_1$ 502. In one or more embodiments, this may render the node coupling the source (S) terminal of $Q_1$ 502 and the drain (D) terminal of $Q_2$ 504 "floating." In one or more embodiments, a voltage may be forced onto the "floating" node created to program the node. In one or more embodiments, PFBK1 542 may be the feedback voltage forced onto the "floating node." In one or more embodiments, PFBK1 542 may be equal to the IO pad 216 voltage during the failsafe mode of operation and the tolerant mode of operation. In one or more embodiments, the other nodes may be appropriately engineered by way of the pre-driver circuits $P_1$ 328 and $P_2$ 330, associated with $Q_3$ 506 and $Q_2$ 504 respectively, outputting $PG_1$ 318 and $PG_2$ 320 to be applied at gate (G) terminals of $Q_3$ 506 and $Q_2$ 504.

In one or more embodiments, during the driver mode of operation, the failsafe mode of operation, and the tolerant mode of operation, $P_3$ 332 may output the minimum of the bias voltage 310 and the IO pad 216 voltage as $PG_3$ 322, based on the controllable utilization of control signal 218. In one or more embodiments, $PG_3$ 322 may be applied at the gate (G) terminal of $Q_1$ 502, whose source (S) terminal and bulk (B) terminal may be coupled to one another. In one or more embodiments, the multiplexing in $P_3$ 332 may serve to protect $Q_1$ 502 against stress due to a high IO pad 216 voltage at the input thereof.

In one or more embodiments, $P_2$ 330 may multiplex $V_{DDIO}$ 204 and bias voltage 310 to the node BIAS_CT 554 based on a controllable utilization of control signal 218. In one or more embodiments, during the driver mode of operation, control signal 218 may be "high" and CSL1 540 may be obtained as an inverted level shifted version of control signal 218. For example, CSL1 540 may be equal to $0.1V_{DDIO}$ and CSL 314 (level shifted version of control signal 218) may be equal to $V_{DDIO}$. In one or more embodiments, PMOS transistor $Q_{15}$ 530 may have the source (S) terminal coupled to bias voltage 310 and the drain (D) terminal coupled to the source (S) terminal of transistor $Q_{16}$ 532. In one or more embodiments, the drain (D) terminal of $Q_{16}$ 532 may be coupled to $V_{DDIO}$ 204. In one or more embodiments, $Q_{16}$ 532, to whose gate (G) terminal CSL1 540 is applied, may be configured to switch ON, and $Q_{15}$ 530, to whose gate (G) terminal CSL 314 is applied, may be configured to switch OFF during the driver mode of operation.

In one or more embodiments, therefore, the node BIAS_CT 540 may follow $V_{DDIO}$ 204. In one or more embodiments, a chain of pass transistors $Q_9$ 518, $Q_{10}$ 520, and $Q_{12}$ 524 may be cascaded to provide a path to transmit PBIAS 316 to $PG_2$ 320 during the driver mode of operation. In one or more embodiments, therefore, the drain (D) terminal of PMOS transistor $Q_9$ 518 may be held at PBIAS 316, and the source (S) terminal of $Q_9$ 518 may be coupled to the source (S) terminal of NMOS transistor $Q_{10}$ 520. In one or more embodiments, the drain (D) terminal of $Q_{10}$ 520 may be coupled to the drain (D) terminal of NMOS transistor $Q_{12}$ 524. In one or more embodiments, the gate (G) terminal of $Q_{10}$ 520 may be held at $V_{DDIO}$ 204 and the gate (G) terminal of $Q_{12}$ 524 may be coupled to the drain (D) terminal of PMOS transistor $Q_{11}$ 522. In one or more embodiments, the source (S) terminal of $Q_{11}$ 522 may be coupled to the drain (D) terminal of $Q_{10}$ 520, and the gate (G) terminal of $Q_{11}$ 522 may be held at $V_{DDIO}$ 204. In one or more embodiments, the gate (G) terminal of $Q_{12}$ 524 and the drain (D) terminal of $Q_{11}$ 522 may be held at the first bias voltage 206, shown as $V_{DDIO\_BIAS}$ 552.

In one or more embodiments, the bulk (B) terminals of NMOS transistors $Q_{10}$ 520 and $Q_{12}$ 524 may be held at the second reference voltage 210, $V_{SS}$ 210, and an output of a floating well (FW 548) circuit may be coupled to the bulk (B) terminal of PMOS transistor $Q_{11}$ 522. In one or more embodiments, FW 548 may serve to prevent forward biasing of parasitic diodes associated with the PMOS transistor $Q_{11}$ 522. In one or more embodiments, PMOS transistor $Q_{11}$ 522 may be provided for protection purposes as described below. In one or more embodiments, the bulk (B) terminal of PMOS transistor $Q_9$ 518 may be held at $V_{DDIO}$ 204.

In one or more embodiments, $Q_9$ 518 may be turned ON during the driver mode of operation as CSL1 540 may be pulled low. In one or more embodiments, $Q_{10}$ 520 may also be turned ON as $V_{DDIO}$ 204 is high (e.g., a $V_{DDIO}$ 204 of 2.75V). In one or more embodiments, when $V_{DDIO\_BIAS}$ 552 may be high, $Q_{12}$ 524 may also be switched ON while $Q_{11}$ 522 may be switched OFF due to the gate (G) terminal thereof being held at $V_{DDIO}$ 204. In one or more embodiments, as $Q_9$ 518, $Q_{10}$ 520, and $Q_{12}$ 524 act as a chain of pass transistors, $PG_2$ 320 may be pulled to PBIAS 316.

In one or more embodiments, when IO pad 216 voltage may be pulled close to the level of $V_{DDIO}$ 204, then IO pad 216 voltage may appear at the node PFBK1 542 through $Q_1$ 502. In one or more embodiments, the voltage at PFBK1 542 may appear at the source (S) terminal of PMOS transistor $Q_{13}$ 526, whose source (S) terminal may be coupled to the source (S) terminal of $Q_{12}$ 524. In one or more embodiments, PMOS transistor $Q_{14}$ 528, whose drain (D) terminal may be coupled to PFBK1 542, does not block the voltage at PFBK1 542 as the gate (G) terminal thereof may be held at bias voltage 310, which is lower. In one or more embodiments, the source (S) terminal of $Q_{14}$ 528 may be coupled to the drain (D) terminal of $Q_{13}$ 526, as shown in FIG. 5. In one or more embodiments, the gate (G) terminal of $Q_{13}$ 526 may be coupled to the node BIAS_CT 554.

In one or more embodiments, the voltage at PFBK1 542 may, however, be blocked at the source (S) terminal of $Q_{13}$ 526 due to the gate (G) terminal thereof being pulled high. In one or more embodiments, therefore, $PG_2$ 320 may not be disturbed by the present of a high IO pad 216 voltage. In one or more embodiments, the voltage at PFBK1 542 may be equal to $V_{DDIO}$ 204 when IO pad 216 voltage is equal to $V_{DDIO}$ 204. In one or more embodiments, bias voltage 310 may then be derived from example Equation 1.

In one or more embodiments, when IO pad 216 voltage is zero, PFBK1 542 may equal PBIAS 316 plus the threshold voltage of $Q_1$ 502. In one or more embodiments, this value may remain less than the upper tolerable limit of the operating voltages of all transistors (e.g., less than 1.98 V for 1.8V device+10% tolerance).

In one or more embodiments, during the failsafe mode of operation where CSL 314 may be pulled "low" (e.g., $0.1V_{DDIO}$) and CSL1 540 may be pulled "high" (e.g., $0.8 V_{DDIO}$), the node BIAS_CT 554 may be configured to track bias voltage 310. In one or more embodiments, this may happen because $Q_{15}$ 530 may be switched ON and $Q_{16}$ 532 may be switched OFF. In one or more embodiments, when IO pad 216 voltage is high, the voltage at PFBK1 542 also may be high, i.e., equal to IO pad 216 voltage. For example, when IO pad 216 voltage reaches 3.465 V (3.3V+5% tolerance), the voltage at PFBK1 542 may also be equal to 3.465 V. In one or more embodiments, the gate (G) terminals of $Q_{13}$ 526 and $Q_{14}$ 528 may be at a lower potential as per example Equation 1. In one or more embodiments, therefore the voltage at PFBK1 542 may appear unhindered as $PG_2$ 320.

In one or more embodiments, as $V_{DDIO}$ 204 may be zero, $Q_{11}$ 522 may be ON and $Q_{10}$ 520 may be OFF, which may result in the node PFBK_FS 546 following $V_{DDIO\_BIAS}$ 552 (first bias voltage 206), which may be set to bias voltage 310. In one or more embodiments, the passing of bias voltage 310 to PFBK_FS 546 may protect $Q_{12}$ 524. In one or more embodiments, $Q_{10}$ 520 may block bias voltage 310 from "passing through." In one or more embodiments, when IO pad 216 voltage is low, none of the voltages across the transistors may cross upper tolerable limits (e.g., 1.98 V) of operating voltages thereof, thereby providing for safety of the transistors.

In one or more embodiments, PFBK_FS 546 may be the feedback between a node PFBK 544 between $Q_3$ 506 and $Q_2$ 504 and $P_2$ 330. In one or more embodiments, the source (S)

terminal of a PMOS transistor $Q_{17}$ 556 may be coupled to PFBK_FS 546, and the drain (D) terminal thereof may be coupled to PFBK 544. In one or more embodiments, the gate (G) terminal of $Q_{17}$ 556 may be held at CSL 314. In one or more embodiments, the output of FW 548 may be applied to bulk (B) terminals of PMOS transistors $Q_{13}$ 526, $Q_{14}$ 528, $Q_{15}$ 530, $Q_{16}$ 532, $Q_{17}$ 556, $Q_2$ 504, and $Q_3$ 506 to prevent forward biasing of parasitic diodes associated with the aforementioned PMOS transistors.

In one or more embodiments, during the tolerant mode of operation where CSL 314 may be pulled low, $Q_{11}$ 522 may be turned OFF and the node BIAS_CT 554 may be configured to follow bias voltage 310. In one or more embodiments, when IO pad 216 voltage may be high, PFBK1 542 also may be high. In one or more embodiments, on account of lower gate (G) voltages of $Q_{13}$ 526 and $Q_{14}$ 528, $PG_2$ 320 may track PFBK1 542. In one or more embodiments, $PG_2$ 320 may be equal to IO pad 216 voltage when IO pad 216 voltage is high (e.g., 3.465 V). In one or more embodiments, as $V_{DDIO}$_BIAS 552 (first bias voltage 206) also may be high, $Q_{11}$ 522 may be OFF and $Q_{12}$ 524 may pass $V_{DDIO}$_BIAS 552 reduced by the threshold voltage of $Q_{12}$ 524. In one or more embodiments, this may ensure that all transistors are safe.

In one or more embodiments, when IO pad 216 voltage may be low, $PG_2$ 320 may track bias voltage 310, with a "drop" in voltage equal to the threshold voltage of $Q_{14}$ 528. In one or more embodiments, this may be due to $Q_{14}$ 528 not allowing the voltage at PFBK1 542 to be transmitted "across." In one or more embodiments, $Q_{14}$ 528 may instead impose the gate (G) voltage thereof (bias voltage 310), in addition to a threshold voltage drop thereof. In one or more embodiments, as $PG_2$ 320 may track a different voltage, the dynamics of $Q_{12}$ 524 may also be changed. In one or more embodiments, as $Q_{12}$ 524 may be a pass transistor, node PFBK_FS 546 may track $PG_2$ 320.

In one or more embodiments, bias voltage 310 may stay in a safety range, which ensures the safety of all transistors having gate (G) terminals connected to $V_{DDIO}$ 204. In one or more embodiments, the output of FW 548 may be generated to be the higher of $V_{DDIO}$ 204 and IO pad 216 voltage to ensure that the bulk (B) terminals, i.e., substrates, of all PMOS transistors are biased to the highest voltage.

In one or more embodiments, $P_1$ 328 may be a multiplexer with a select line of CSL 314. In one or more embodiments, the inputs may be $V_{DDIO}$ 204 and $V_{DDIO}$_BIAS 552. In one or more embodiments, during the driver mode of operation, CSL 314 may be high (e.g., $V_{DDIO}$) and another inverted level shifted version of control signal 218, CSL2 558, may be low (e.g., 0.4 $V_{DDIO}$). In one or more embodiments, $P_1$ 328 may include an inverter configured to receive pre-driver input A 312 generated at the IO core. In one or more embodiments, the inverter may include a PMOS transistor $Q_5$ 510 coupled to an NMOS transistor $Q_6$ 512 by way of the drain (D) terminal of $Q_5$ 510 being coupled to the drain (D) terminal of $Q_6$ 512. In one or more embodiments, the output of FW 548 may be applied to the bulk (B) terminal of $Q_5$ 510. In one or more embodiments, the source (S) terminal of $Q_6$ 512 may be held at PBIAS 316 and the bulk (B) terminal thereof may be held at the second reference voltage 210 ($V_{SS}$).

In one or more embodiments, the source (S) terminal of $Q_5$ 510 may be applied to the drain (D) terminal of PMOS transistor $Q_4$ 508. In one or more embodiments, the source (S) terminal of $Q_4$ 508 may be held at $V_{DDIO}$ 204 and the output of FW 548 may be applied at the bulk (B) terminal thereof. In one or more embodiments, the gate (G) terminal of $Q_4$ 508 may be held at CSL2 558. In one or more embodiments, node INT 550, at the path coupling $Q_5$ 510 and $Q_4$ 508, may be coupled to the drain (D) terminal of PMOS transistor $Q_7$ 514. In one or more embodiments, the source (S) terminal of $Q_7$ 514 may be coupled to the drain (D) terminal of another PMOS transistor $Q_8$ 516. In one or more embodiments, CSL 314 may be applied to the gate (G) terminals of $Q_7$ 514 and $Q_8$ 516. In one or more embodiments, the source (S) terminal of $Q_7$ 514 and the drain (D) terminal of $Q_8$ 516 may both be held at $V_{DDIO}$_BIAS 552. In one or more embodiments, the output of the source (S) terminal of $Q_8$ 516 may be coupled to $PG_1$ 318, which may be applied to the gate (G) terminal of $Q_3$ 506.

In one or more embodiments, $PG_1$ 318 may be taken as the output of the inverter at the path coupling the drain (D) terminal of $Q_5$ 510 and the drain (D) terminal of $Q_6$ 512. In one or more embodiments, the output of FW 548 may be applied to the bulk (B) terminals of $Q_4$ 508, $Q_7$ 514, and $Q_8$ 516. In one or more embodiments, PFBK 544 may be the voltage at the input (i.e., drain (D) terminal) of $Q_3$ 506.

In one or more embodiments, during the driver mode of operation, the node INT 550 may track $V_{DDIO}$ 204 when CSL 314 is high. In one or more embodiments, this may be because $Q_4$ 508 may be switched ON due to CSL2 558 being pulled low. In one or more embodiments, as $Q_7$ 514 and $Q_8$ 516 may be OFF, the voltage at $PG_1$ 318 is the inversion of the voltage at the input A 312.

In one or more embodiments, during the failsafe/tolerant mode of operation, control signal 218 and CSL 314 may be low. For example, CSL 314 may be 0 during the failsafe mode of operation and 0.4$V_{DDIO}$ during the tolerant mode of operation. In one or more embodiments, CSL2 558 may be high (e.g., $V_{DDIO}$ 204 during the tolerant mode of operation). In one or more embodiments, $Q_4$ 508 may, therefore, be turned OFF, and $Q_7$ 514 and $Q_8$ 516 may be turned ON. In one or more embodiments, this may result in the node INT 550 tracking $V_{DDIO}$_BIAS 552. In one or more embodiments, $PG_1$ 318 may also be clamped at $V_{DDIO}$_BIAS 552. In one or more embodiments, $V_{DDIO}$_BIAS 552 may be equal to bias voltage 310 during the failsafe mode of operation and equal to $V_{DDIO}$ 204 during the tolerant mode of operation.

In one or more embodiments, the multiplexing at $P_1$ 328, $P_2$ 330, and $P_3$ 332 may generate voltages $PG_1$ 318, $PG_2$ 320, and $PG_3$ 322 to be applied at the gate (G) terminals of $Q_3$ 506, $Q_2$ 504, and $Q_1$ 502 respectively such that $Q_3$ 506, $Q_2$ 504, and $Q_1$ 502 may be protected during the failsafe mode of operation and the tolerant mode of operation. In addition, in one or more embodiments, control signal 218 may be controllably utilized to multiplex voltage levels in each of $P_1$ 328, $P_2$ 330, and $P_3$ 332.

Figure 6:
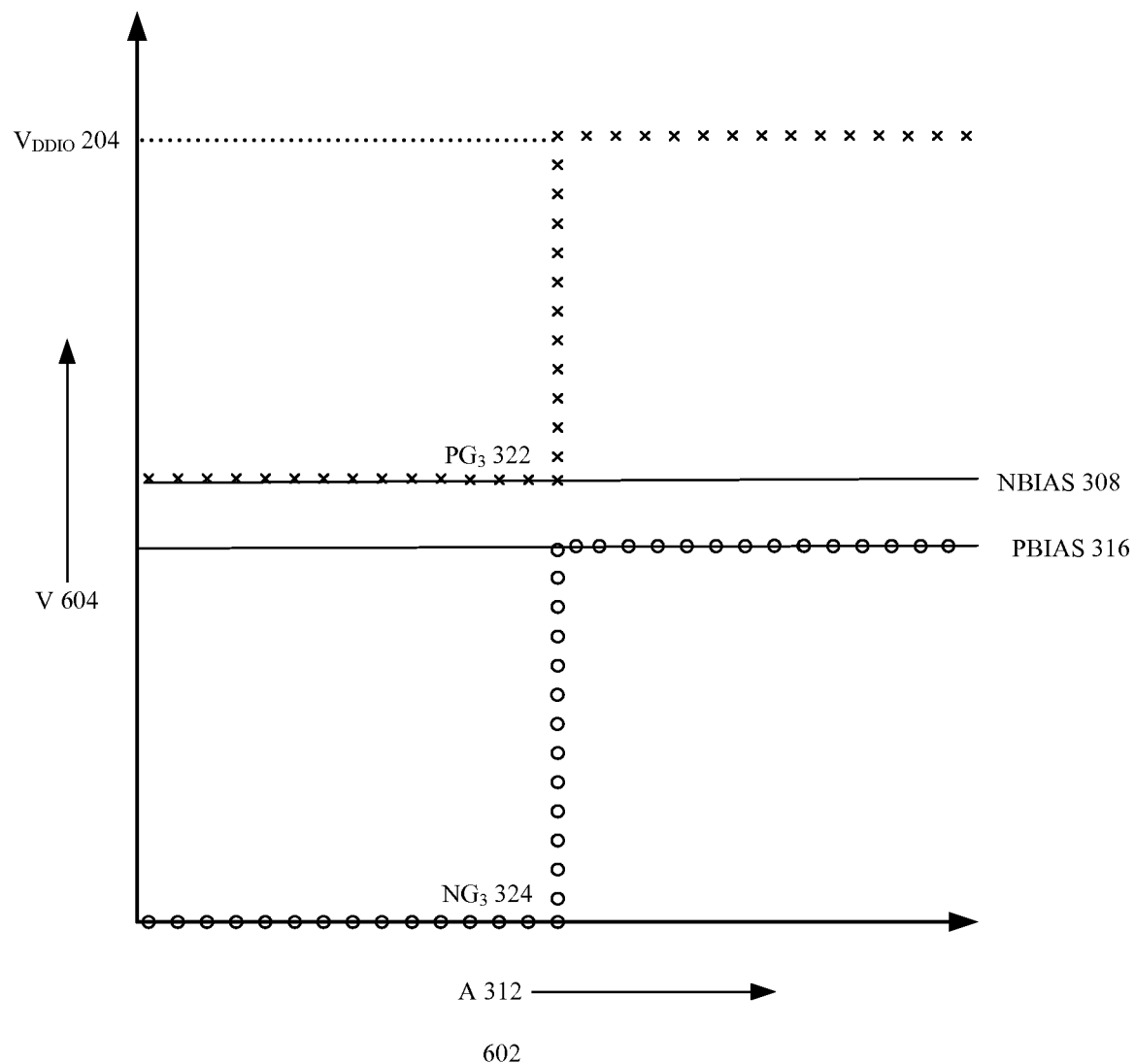
FIG. 6 is a plot of the DC characteristics of the transistor implementation of the driver architecture of FIG. 3 during a driver mode of operation, according to one or more embodiments.

FIG. 6 shows the DC characteristics of the transistor implementation 500 of the driver 300 architecture of FIG. 3 during the driver mode of operation, according to one or more embodiments. In one or more embodiments, the x-axis 602 may represent pre-driver input voltage A 312 generated at the IO core, and the y-axis 604 may represent a voltage variable (V). In one or more embodiments, as shown in FIG. 4, $PG_3$ 322 may swing from NBIAS 308 (or PBIAS 316 as applicable) to $V_{DDIO}$ 204 as A 312 is swept from 0 to a high value thereof. In one or more embodiments, the analogous $NG_3$ 324 may swing from 0 to PBIAS 316 (or NBIAS 308 as applicable). In one or more embodiments, PBIAS 316 and NBIAS 308 may be fractions of $V_{DDIO}$ 204 (e.g., PBIAS 316 equal to 0.45 $V_{DDIO}$ and NBIAS 308 equal to 0.55 $V_{DDIO}$).

Figure 7:
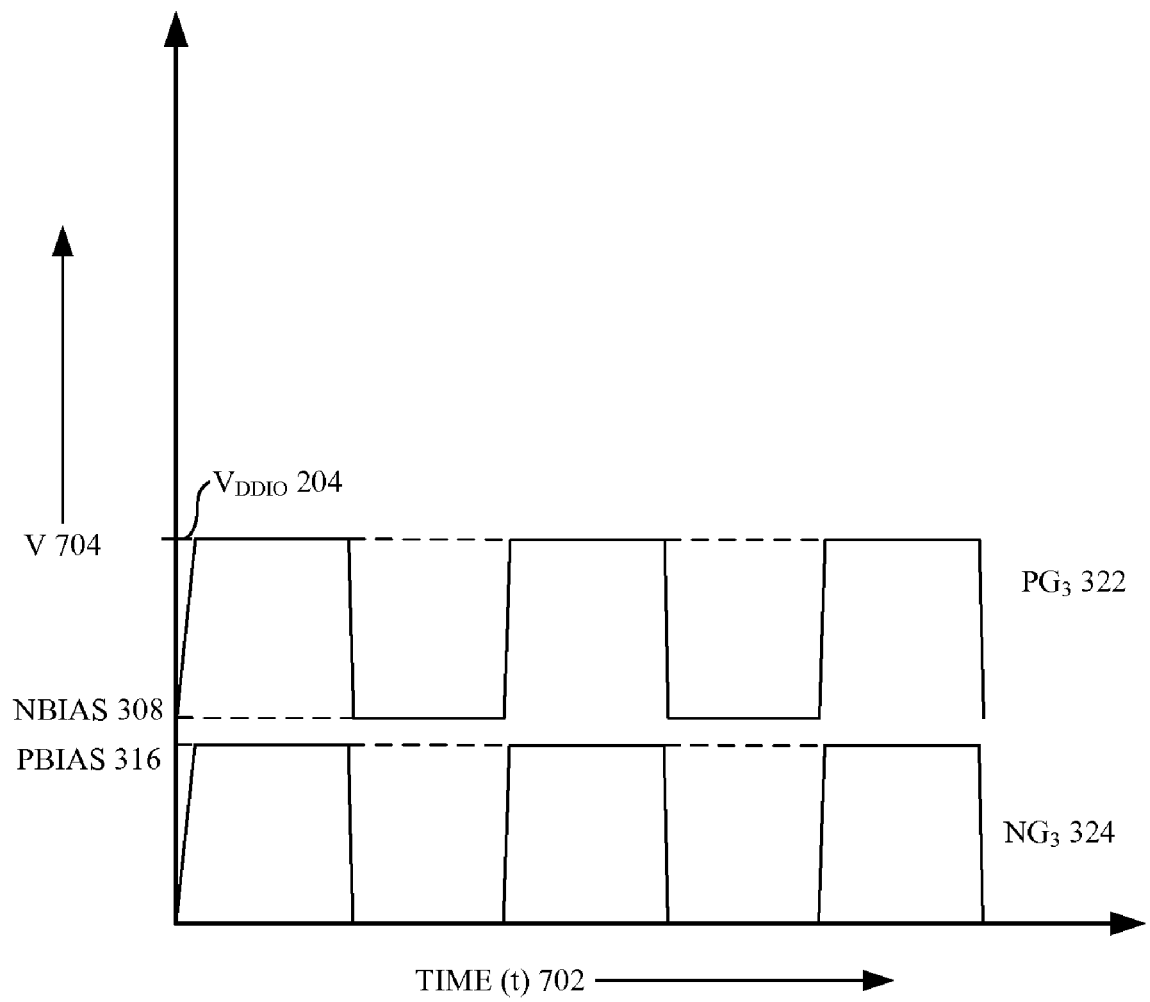
FIG. 7 is a plot of the transient characteristics of the transistor implementation of the driver architecture of FIG. 3 during the driver mode of operation, according to one or more embodiments.

FIG. 7 shows the transient characteristics of the transistor implementation 500 of the driver 300 architecture of FIG. 3 during the driver mode of operation, according to one or more embodiments. In one or more embodiments, the x-axis 702 may refer to time (t) and the y-axis 704 may be a voltage variable (V). In one or more embodiments, as the IO pad 216 voltage swings from 0 to $V_{DDIO}$ 204 and vice versa, $PG_3$ 322 may swing from NBIAS 308 (or PBIAS 316 as applicable) to $V_{DDIO}$ 204, and $NG_3$ 324 may swing from 0 to PBIAS 316 (or NBIAS 308 as applicable), as shown in FIG. 7.

Figure 8:
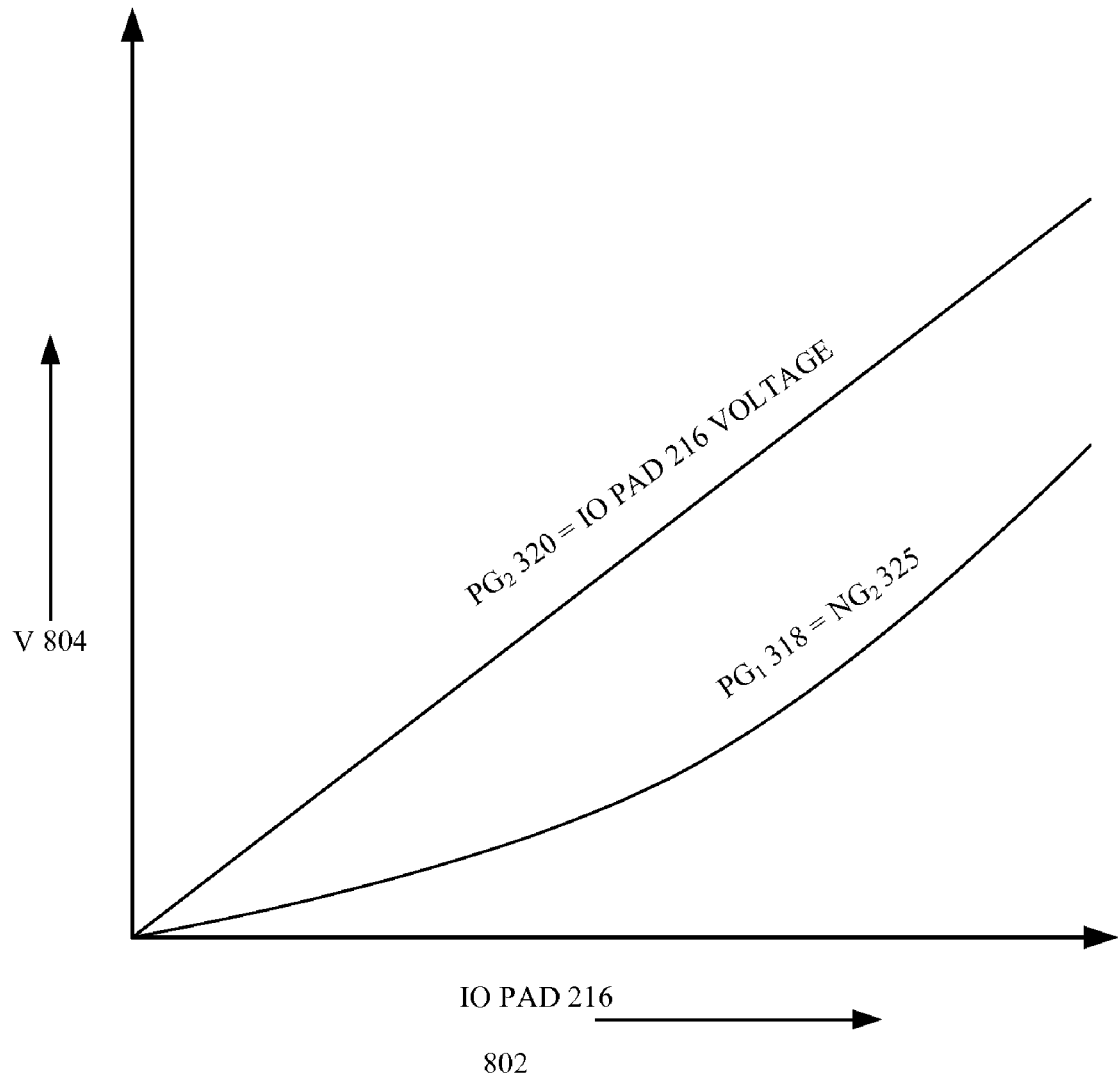
FIG. 8 is a plot of the DC characteristics of the transistor implementation of the driver architecture of FIG. 3 during a failsafe mode of operation, according to one or more embodiments.

FIG. 8 shows the DC characteristics of the transistor implementation 500 of the driver 300 architecture of FIG. 3 during the failsafe mode of operation, according to one or more embodiments. In one or more embodiments, the x-axis 802 may refer to IO pad 216 voltage and the y-axis 804 may refer to a voltage variable (V). In one or more embodiments, the supply voltage $V_{DDIO}$ 204 may be zero during the failsafe mode of operation, as discussed above. In one or more embodiments, as IO pad 216 voltage is swept from 0 to the highest value thereof (e.g., 3.465 V), $PG_1$ 318 may follow $NG_2$ 325. In one or more embodiments, PFBK 544 (not shown) may also follow $NG_2$ 325. In one or more embodiments, $PG_2$ 320 may follow IO pad 216 voltage and may be equal to IO pad 216 voltage.

Figure 9:
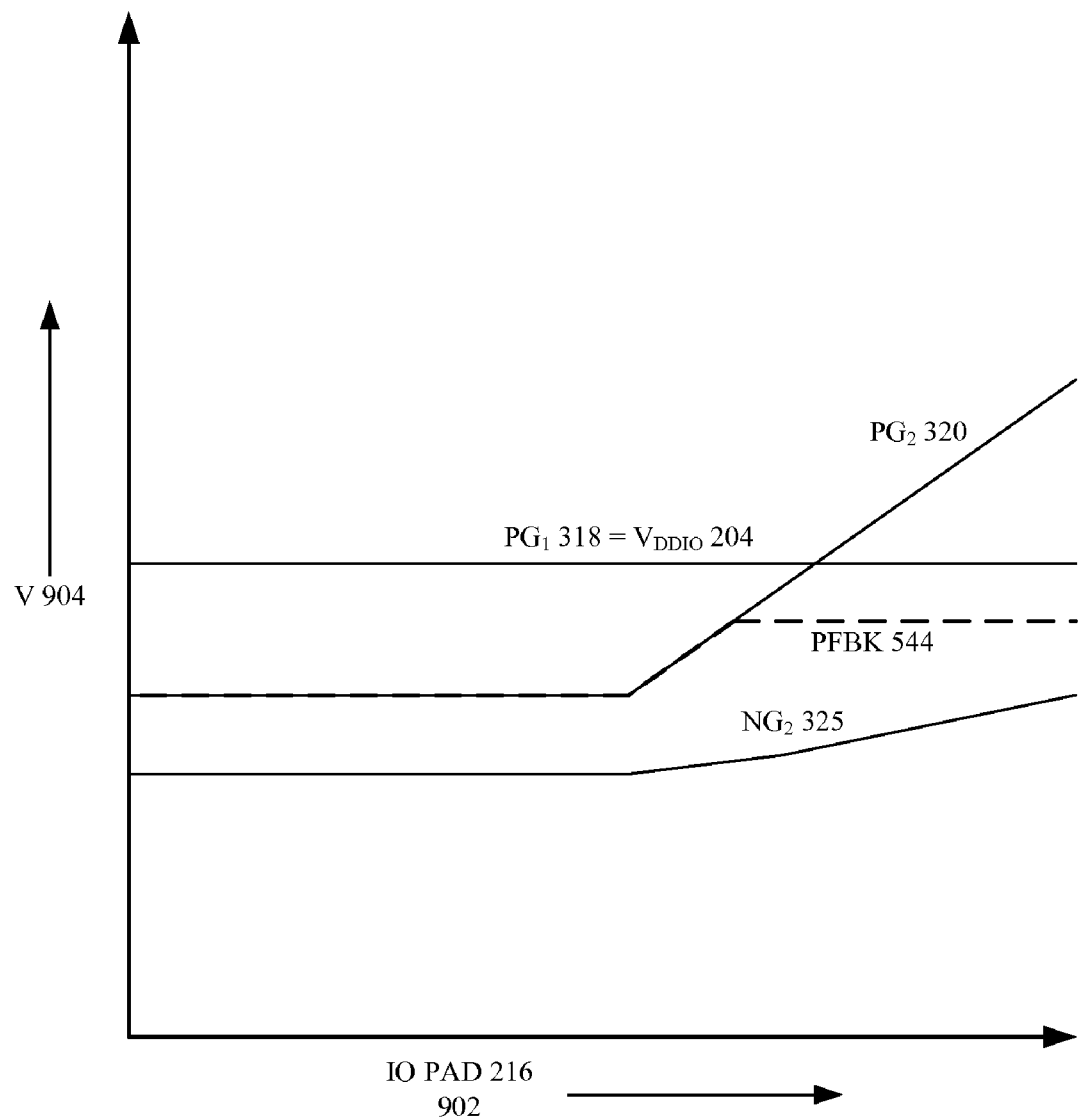
FIG. 9 is a plot of the DC characteristics of the transistor implementation of the driver architecture of FIG. 3 during a tolerant mode of operation, according to one or more embodiments.

FIG. 9 shows the DC characteristics of the transistor implementation 500 of the driver 300 architecture of FIG. 3 during the tolerant mode of operation, according to one or more embodiments. In one or more embodiments, the x-axis 902 may refer to IO pad 216 voltage and the y-axis 904 may refer to a voltage variable (V). In one or more embodiments, as the IO pad 216 voltage is swept from 0 to a value higher than $V_{DDIO}$ 204 (e.g., 3.465 V), $PG_1$ 318 may be constant at $V_{DDIO}$ 204, as discussed above and as shown in FIG. 9. In one or more embodiments, $PG_2$ 320 may follow IO pad 216 voltage as IO pad 216 voltage increases and PFBK 544 may settle down at $V_{DDIO}$ 204 reduced by a transistor threshold voltage, as shown in FIG. 9. In one or more embodiments, $NG_2$ 325 may follow IO pad 216 voltage as IO pad 216 voltage increases and settle at IO pad 216 voltage reduced by the voltage drop across two active circuit elements.

Figure 10:
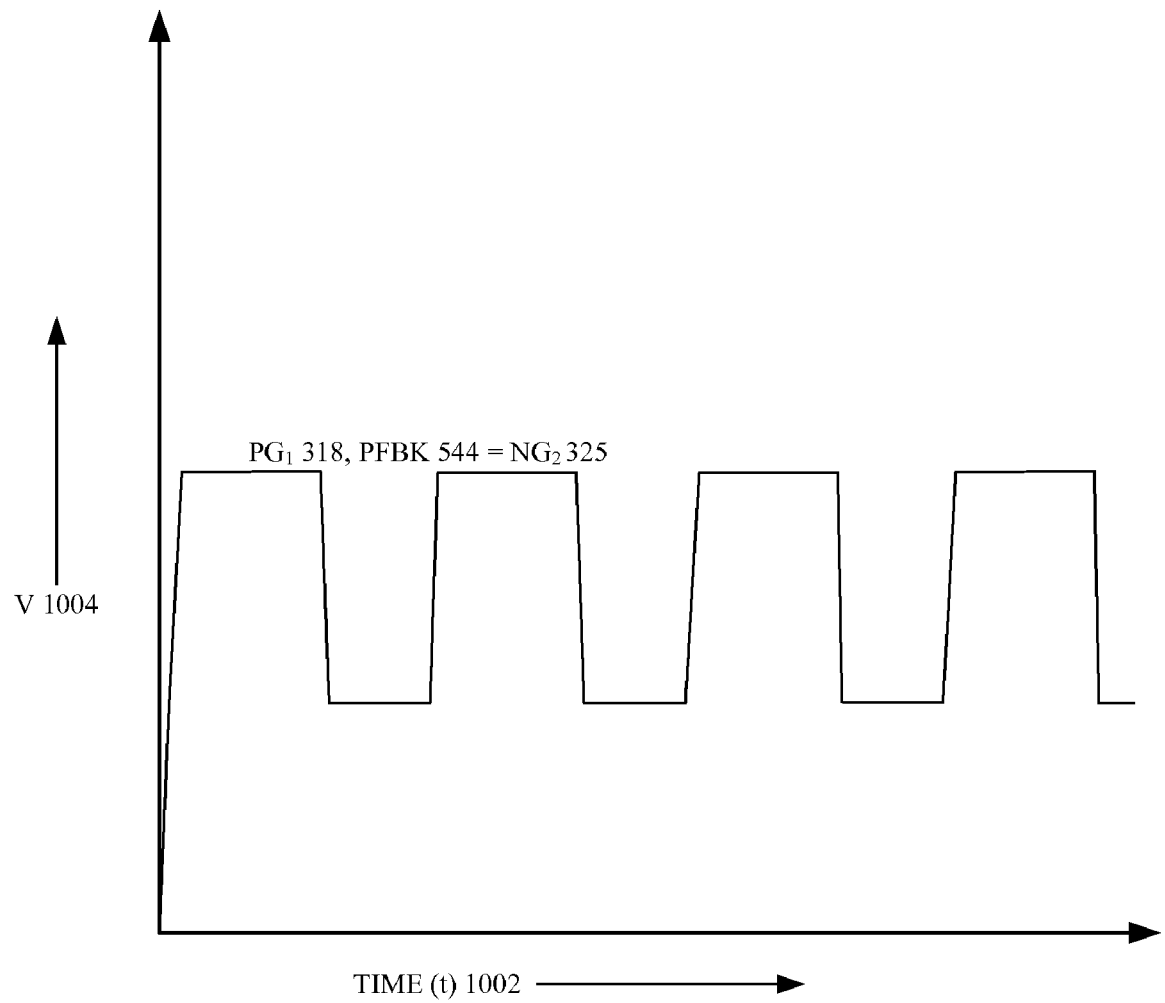
FIG. 10 is a plot of the transient characteristics of the transistor implementation of the driver architecture of FIG. 3 during the failsafe mode of operation, according to one or more embodiments.

FIG. 10 shows the transient characteristics of the transistor implementation 500 of the driver 300 architecture of FIG. 3 during the failsafe mode of operation, according to one or more embodiments. In one or more embodiments, the x-axis 1002 may refer to time (t) and the y-axis 1004 may refer to a voltage variable (V). In one or more embodiments, as the IO pad 216 voltage swings from 0 to a maximum value thereof (e.g., 3.465 V) and vice versa, $PG_1$ 318 and PFBK 544 may follow $NG_2$ 325. In one or more embodiments, $NG_2$ 325 (and hence $PG_1$ 318) may be clamped at a value higher than 0 during the decrease of IO pad 216 voltage. In one or more embodiments, $PG_2$ 320 may be equal to IO pad 216 voltage when IO pad 216 voltage increases, and may be clamped at a value higher than 0 when IO pad 216 voltage decreases.

Figure 11:
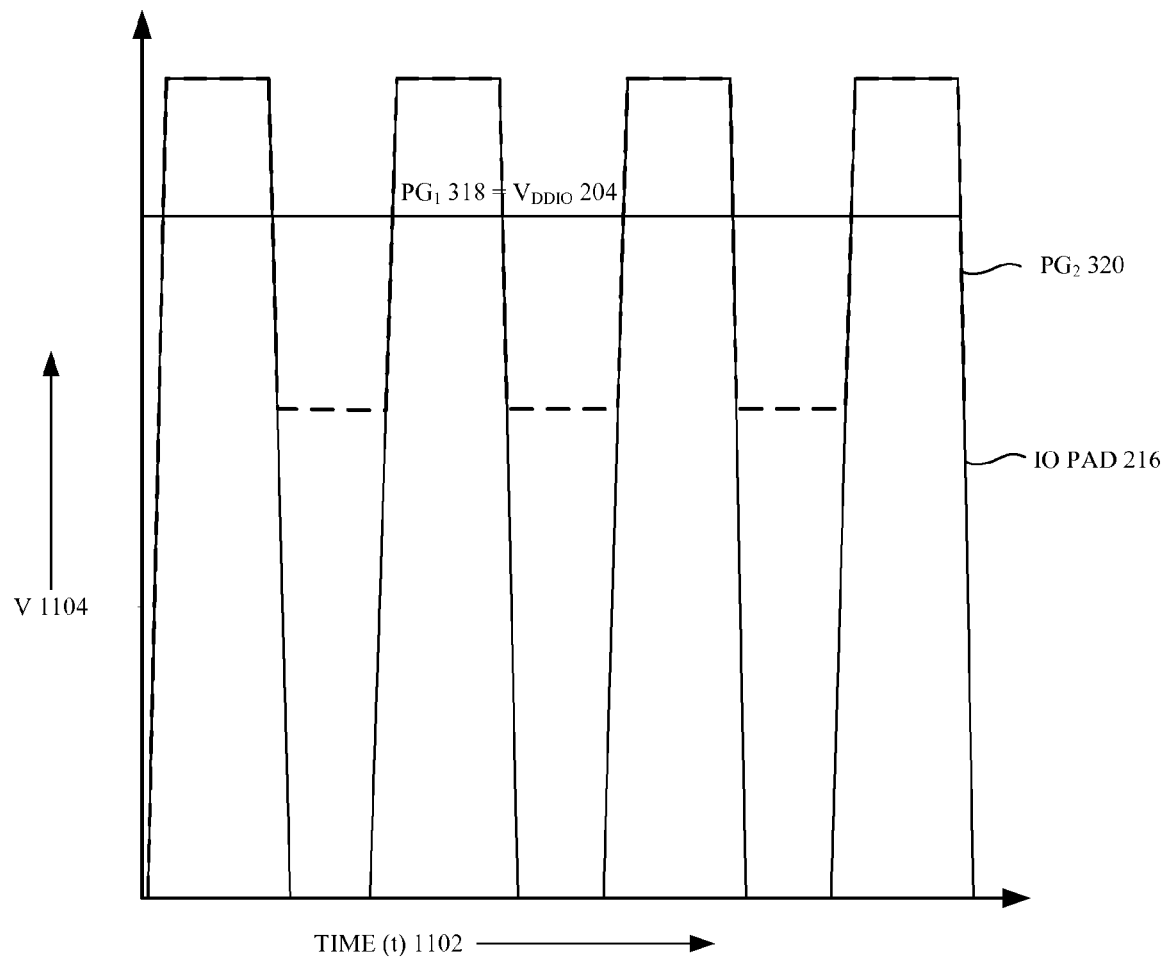
FIG. 11 is a plot of the transient characteristics of the transistor implementation of the driver architecture of FIG. 3 during the tolerant mode of operation, according to one or more embodiments.

FIG. 11 shows the transient characteristics of the transistor implementation 500 of the driver 300 architecture of FIG. 3 during the tolerant mode of operation, according to one or more embodiments. In one or more embodiments, the x-axis 1102 may refer to time (t) and the y-axis 1104 may refer to a voltage variable (V). In one or more embodiments, as the IO pad 216 voltage swings from 0 to the highest value thereof (e.g., 3.465 V), $PG_1$ 318 may stay constant at $V_{DDIO}$ 204, as discussed above and as shown in FIG. 11. In one or more embodiments, $PG_2$ 320 may be equal to IO pad 216 voltage when IO pad 216 voltage increases, and may be clamped at a value higher than 0 when IO pad 216 voltage decreases.

Figure 12:
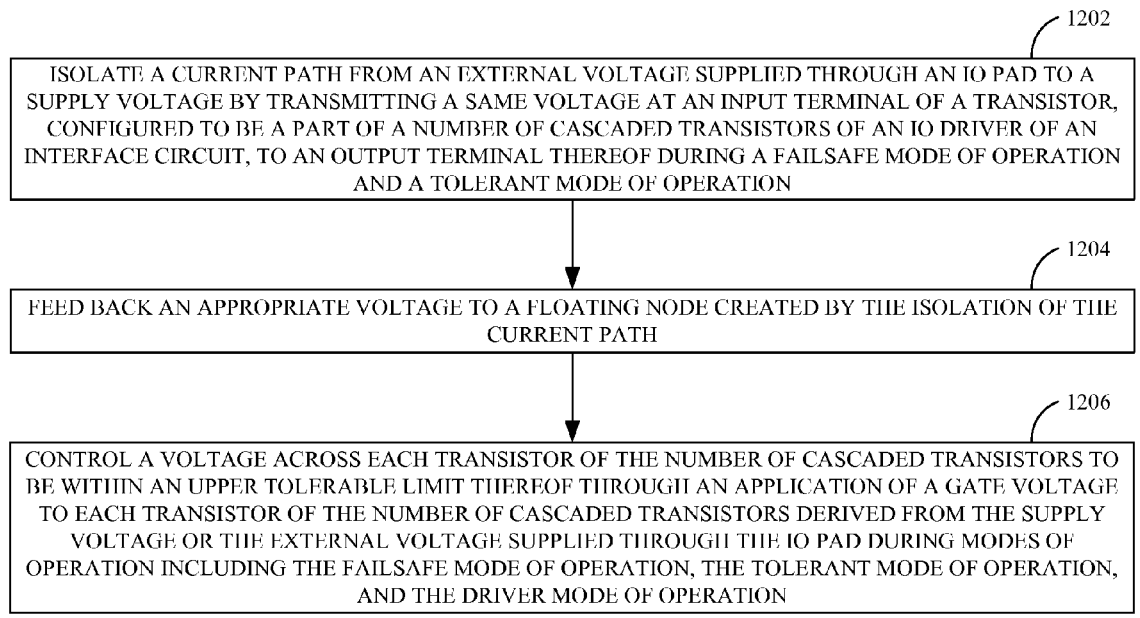
FIG. 12 is a process flow detailing the operations involved in a method of ensuring a reliability of the driver architecture of FIG. 3, according to one or more embodiments.

FIG. 12 is a process flow diagram detailing the operations involved in a method of ensuring reliability of an IO driver 300, according to one or more embodiments. In one or more embodiments, the method may involve controllable utilization of control signal 218 generated at the IO core. In one or more embodiments, operation 1202 may involve isolating a current path from IO pad 216 voltage to $V_{DDIO}$ 204 by transmitting a same voltage (e.g., IO pad 216 voltage) at an input terminal of a transistor (e.g., MOS transistor), configured to be a part of a number of cascaded transistors of the IO driver 300 of an interface circuit, to an output terminal thereof during the failsafe mode of operation and the tolerant mode of operation.

In one or more embodiments, operation 1204 may involve feeding back an appropriate voltage to a "floating" node created by the aforementioned isolation of the current path. In one or more embodiments, operation 1206 may involve controlling a voltage across each transistor of the number of cascaded transistors to be within an upper tolerable limit thereof through an application of a gate voltage to each transistor of the number of cascaded transistors derived from the supply voltage 204 ($V_{DDIO}$ 204) or IO pad 216 voltage during the failsafe mode of operation, the tolerant mode of operation, and the driver mode of operation.

In one or more embodiments, IO pad 216 voltage may vary from zero to $V_{DDIO}$ 204 during the driver mode of operation. In one or more embodiments, $V_{DDIO}$ 204 may be zero during the failsafe mode of operation, and IO pad 216 voltage may increase to a value above $V_{DDIO}$ 204 during the tolerant mode of operation.

Although the present embodiments have been described with reference to specific example embodiments, it will be evident that various modifications and changes may be made to these embodiments without departing from the broader spirit and scope of the various embodiments. For example, variations in operating voltages and/or external voltages are within the scope of the exemplary embodiments. Also, for example, the various devices and modules described herein may be enabled and operated using hardware circuitry (e.g., CMOS based logic circuitry), firmware, software or any combination of hardware, firmware, and software (e.g., embodied in a machine readable medium). For example, the various electrical structure and methods may be embodied using transistors, logic gates, and electrical circuits (e.g., application specific integrated (ASIC) circuitry and/or in Digital Signal Processor (DSP) circuitry).

In addition, it will be appreciated that the various operations, processes, and methods disclosed herein may be embodied in a machine-readable medium and/or a machine accessible medium compatible with a data processing system (e.g., a computer devices), and may be performed in any order (e.g., including using means for achieving the various operations). Accordingly, the specification and drawings are to be regarded in an illustrative rather than a restrictive sense.

What is claimed is:

1. A method comprising controllably utilizing a control signal generated by an Input/Output (IO) core to:
    isolate, during a failsafe mode of operation and a tolerant mode of operation, a current path from an external voltage supplied through an IO pad to a supply voltage by transmitting a same voltage at an input terminal of a transistor, configured to be part of a plurality of cascaded transistors of an IO driver of an interface circuit, to an output terminal thereof;
    feed back an appropriate voltage to a floating node created by the isolation of the current path; and
    control a voltage across each transistor of the plurality of cascaded transistors to be within an upper tolerable limit thereof through an application of a gate voltage to each transistor of the plurality of cascaded transistors derived from one of the supply voltage and the external voltage supplied through the IO pad during modes of operation thereof, the modes of operation including the failsafe mode of operation, the tolerant mode of operation, and a driver mode of operation, wherein the external voltage supplied through the IO pad varies from zero to a value of the supply voltage during the driver mode of operation, wherein the supply voltage is zero during the failsafe mode of operation, and wherein the external voltage supplied through the IO pad increases to a value above the supply voltage during the tolerant mode of operation.

2. The method of claim 1, comprising deriving the gate voltage as at least one of a fraction of the supply voltage and as the external voltage supplied through the IO pad reduced by a threshold voltage of at least one active circuit element.

3. The method of claim 1, comprising deriving the gate voltage through a multiplexing of a voltage derived from the supply voltage and a voltage derived from the external voltage supplied through the IO pad based on a corresponding low value state and a high value state of the control signal.

4. The method of claim 1, comprising isolating the current path between the supply voltage and the external voltage supplied through the IO pad during the failsafe mode of operation and the tolerant mode of operation by transmitting the external voltage supplied through the IO pad to the output terminal of a transistor, configured to be a part of the plurality of cascaded transistors and coupled directly to the external voltage supplied through the IO pad at the input terminal thereof.

5. The method of claim 4, further comprising providing at least one pass transistor directly coupled to the output terminal of the transistor configured to be a part of the plurality of cascaded transistors and coupled directly to the external voltage supplied through the IO pad at the input terminal thereof to output the external voltage supplied through the IO pad during the failsafe mode of operation and the tolerant mode of operation to be applied at a gate terminal of an adjacent transistor, configured to be part of the plurality of cascaded transistors of the IO driver and directly coupled to the transistor coupled directly to the external voltage supplied through the IO pad.

6. The method of claim 1, further comprising providing a plurality of cascaded pass transistors configured to output the voltage derived from the supply voltage at a gate terminal of the transistor configured to be a part of the plurality of cascaded transistors of the IO driver during the driver mode of operation.

7. The method of claim 1, further comprising providing a control circuit to feed back a voltage from a path coupling a transistor, configured to be a part of the plurality of cascaded transistors of the IO driver, to another transistor, configured to be a part of the plurality of cascaded transistors of the IO driver, to a pre-driver circuit of the another transistor.

8. The method of claim 1, comprising coupling the output terminal of the transistor, configured to have the voltage at the input terminal thereof transmitted to the output terminal thereof during the failsafe mode of operation and the tolerant mode of operation, to a substrate thereof.

9. The method of claim 1, further comprising applying an output of a floating well (FW) circuit to a substrate of each p-channel transistor of the plurality of cascaded transistors of the IO driver not configured to have the voltage at the input terminal thereof transmitted to the output terminal thereof during the failsafe mode of operation and the tolerant mode of operation.

10. The method of claim 1, further comprising providing an output of an inverter circuit as the gate voltage to be applied to a transistor, configured to be part of the plurality of cascaded transistors of the IO driver and directly coupled to the supply voltage, during the driver mode of operation.

11. The method of claim 10, further comprising providing at least one pass transistor configured to output one of a voltage derived from the supply voltage and a voltage derived from the external voltage supplied through the IO pad during a corresponding one of the tolerant mode of operation and the failsafe mode of operation.

12. An IO driver circuit comprising:
a plurality of cascaded transistors; and
a pre-driver circuit associated with each transistor of the plurality of cascaded transistors to control a voltage across each transistor to be within an upper tolerable limit thereof through an application of a gate voltage to each transistor derived from one of a supply voltage and an external voltage supplied through an IO pad during modes of operation thereof based on a controllable utilization of a control signal generated by an IO core, the modes of operation including a driver mode, a failsafe mode, and a tolerant mode, wherein a current path from the external voltage supplied through the IO pad to the supply voltage is isolated by transmitting a same voltage at an input terminal of a transistor of the plurality of cascaded transistors to an output terminal thereof, wherein an appropriate voltage is fed back to a floating node created by the isolation of the current path, wherein the external voltage supplied through the IO pad varies from zero to a value of the supply voltage during the driver mode of operation, wherein the supply voltage is zero during the failsafe mode of operation, and wherein the external voltage supplied through the IO pad increases to a value above the supply voltage during the tolerant mode of operation.

13. The IO driver circuit of claim 12, wherein the gate voltage is derived to be at least one of a fraction of the supply voltage and the external voltage supplied through the IO pad reduced by a threshold voltage of at least one active circuit element.

14. The IO driver circuit of claim 12, wherein the gate voltage is derived based on a low value state and a high value state of the control signal generated by the IO core.

15. The IO driver circuit of claim 12, wherein the current path between the supply voltage and the external voltage supplied through the IO pad is isolated during the failsafe mode of operation and the tolerant mode of operation by transmitting the external voltage supplied through the IO pad to the output terminal of a transistor, configured to be a part of the plurality of cascaded transistors and coupled directly to the external voltage supplied through the IO pad at the input terminal thereof.

16. The IO driver circuit of claim 12, wherein a pre-driver circuit associated with a transistor, configured to be a part of the plurality of cascaded transistors, further comprises a control circuit to feed back a voltage from a path coupling the transistor to another transistor of the plurality of cascaded transistors to a pre-driver circuit associated with the another transistor.

17. The IO driver circuit of claim 12, wherein the output terminal of the transistor configured to have the voltage at the input terminal thereof transmitted to the output terminal thereof during the failsafe mode of operation and the tolerant mode of operation, is coupled to a substrate thereof.

18. The IO driver circuit of claim 12, wherein an output of a floating well (FW) circuit is applied to a substrate of each p-channel transistor of the plurality of cascaded transistors of the IO driver circuit not configured to have the voltage at the input terminal thereof transmitted to the output terminal thereof during the failsafe mode of operation and the tolerant mode of operation.

19. An TO circuit system comprising:

an IO core to generate a control signal;

an IO pad to supply an external voltage; and an IO driver circuit to interface with the external voltage supplied by the IO pad based on a controllable utilization of the control signal generated by the IO core, the IO driver circuit comprising:

a plurality of cascaded transistors; and a pre-driver circuit associated with each transistor of the plurality of cascaded transistors to control a voltage across each transistor to be within an upper tolerable limit thereof through an application of a gate voltage to each transistor derived from one of a supply voltage and the external voltage supplied through the IO pad during modes of operation thereof, the modes of operation including a driver mode, a failsafe mode, and a tolerant mode, wherein a current path from the external voltage supplied through the IO pad to the supply voltage is isolated by transmitting a same voltage at an input terminal of a transistor of the plurality of cascaded transistors to an output terminal thereof, wherein an appropriate voltage is fed back to a floating node created by the isolation of the current path, wherein the external voltage supplied through the IO pad varies from zero to a value of the supply voltage during the driver mode of operation, wherein the supply voltage is zero during the failsafe mode of operation, and wherein the external voltage supplied through the IO pad increases to a value above the supply voltage during the tolerant mode of operation.

20. The IO circuit system of claim 19, wherein an output of a floating well (FW) circuit is applied to a substrate of each p-channel transistor of the plurality of cascaded transistors of the IO driver circuit not configured to have the voltage at the input terminal thereof transmitted to the output terminal thereof during the failsafe mode of operation and the tolerant mode of operation.

* * * * *